United States Patent [19]

Gallios

[11] Patent Number: 4,742,294

[45] Date of Patent: May 3, 1988

[54] HELIX CURRENT SENSE SYSTEM

[75] Inventor: George C. Gallios, Setauket, N.Y.

[73] Assignee: Venus Scientific Inc., Farmingdale, N.Y.

[21] Appl. No.: 886,809

[22] Filed: Jul. 16, 1986

[51] Int. Cl.[4] ...................... G01R 31/24; G01R 19/04

[52] U.S. Cl. ................................ 324/117 R; 315/3.5; 324/105

[58] Field of Search ................. 315/3.5; 340/643, 662; 324/105, 71.3, 117 R, 222, 223, 224, 227, 253, 254, 235; 342/104, 107, 109; 336/214, 179, 131

[56] References Cited

U.S. PATENT DOCUMENTS

| | | | |
|---|---|---|---|
| 1,511,595 | 10/1924 | Fahy | 324/227 |
| 1,882,773 | 10/1932 | Callsen | 336/214 |
| 3,750,010 | 7/1973 | Abnett et al. | 336/179 |
| 3,936,732 | 2/1976 | Modiano | 315/3.5 |
| 4,050,013 | 9/1977 | Maddox | 324/117 R |
| 4,266,190 | 5/1981 | Lipman | 324/117 R |
| 4,274,051 | 6/1981 | Condon | 324/117 R |
| 4,280,162 | 7/1981 | Tanka et al. | 324/117 R |
| 4,475,078 | 10/1984 | Itani | 324/254 |
| 4,482,862 | 11/1984 | Leehey | 324/117 R |
| 4,529,931 | 7/1985 | Kuhns | 324/117 R |
| 4,558,310 | 12/1985 | McAllise | 340/662 |

FOREIGN PATENT DOCUMENTS

| | | | |
|---|---|---|---|
| 0789830 | 12/1980 | U.S.S.R. | 324/117 R |
| 1137410 | 1/1985 | U.S.S.R. | 324/222 |

OTHER PUBLICATIONS

"The Zero-Flux DC Current Transformer, A High Precision Bipolar Wide-Band Measuring Device", by Appelo et al., IEEE Trans. on Nuc. Sci., pp. 1810–1811, NS-24, #3, 6177.

*Primary Examiner*—Reinhard J. Eisenzopf
*Assistant Examiner*—W. Burns
*Attorney, Agent, or Firm*—Ostrolenk, Faber, Gerb & Soffen

[57] ABSTRACT

A magnetic sensor for measuring the helix current of a traveling wave tube (TWT). The sensor includes a helix current sense inductor and a reference inductor. The sense inductor includes windings for receiving the cathode and collector currents of the TWT and for receiving a bias current, and also a sense winding. The cathode and collector currents cause permeability of the core to vary in proportion to the difference between those currents, which is equal to the helix current. The bias current is supplied to the bias winding to compensate the sense inductor for temperature-related permeability variations. The bias current is supplied by the reference inductor which is selected to have magnetic properties which match those of the sense inductor. A plurality of sense inductors in conjunction with one common reference inductor may be used for sensing the respective helix currents in the TWTs in a multi-TWT array.

23 Claims, 6 Drawing Sheets

HELIX CURRENT SENSE SYSTEM

BACKGROUND OF THE INVENTION

The present invention relates to a current sensing device. It relates more particularly to a device for measuring the difference between the currents flowing in two wires having a very large voltage difference therebetween, such as the collector and cathode circuits of a traveling wave tube, which is capable of accurately measuring small current differences over a wide range of ambient temperatures.

In a traveling wave tube (TWT), as is well known, a stream of electrons interacts with an electromagnetic wave carried on a helically wound conductor, which is generally referred to as the helix. The stream of electrons is released from a cathode and travels within the helix toward a collector. Those electrons reaching the collector constitute the collector current. According to the positive current convention, the collector current will be considered herein as flowing from the collector to the cathode.

Those electrons which do not reach the collector, but go astray and impact the helix, constitute the helix current. The sum of the helix current and the collector current therefore equals the cathode current.

The helix current is a measure of the quality or effectiveness of the operation of a TWT, and should be as low as possible. However, even in a very good TWT, a helix current of approximately 0.5 percent of the cathode current is present. On the other hand, if the helix current is 15–20 percent of the cathode current, this is considered marginal or inadequate performance for the TWT. Excessive helix current, moreover, must be prevented to avoid catastrophic hardware damage.

It is necessary, therefore, to continually monitor the helix current of the TWT to ensure immediate detection of unsafe or undesirably high helix current levels, say, above about 8 to 12 percent of the cathode current. However, helix current sensing is rendered difficult by the large potential differences encountered in the TWT. For example, in a typical miniature TWT the cathode electrode will operate at a voltage of approximately −4,000 volts and the collector at a potential of approximately +2,000 volts with respect to the cathode, that is, an absolute level of −2,000 volts. Moreover, because of radio frequency design considerations the helix itself is held at ground potential, that is, at approximately 4,000 volts above the cathode voltage.

The high voltages in the TWT prevent the employment of ordinary electronic techniques for measuring the helix current. In the special case where a system employs only a single TWT, the helix current can be measured directly, since it is the current that flows in the ground terminal of the power supply of the TWT. In many systems, however, a plurality of TWTs are used. For example, in phased array systems and in many airborne radars and similar devices, arrays of TWTs are used. Conventional techniques are not able to measure the individual helix current of each TWT.

Helix currents can be measured indirectly, however, by subtracting the measured collector current from the measured cathode current, since the current that flows at the cathode electrode equals the collector current plus the helix current.

To indirectly detect a helix current by this method, in a high voltage environment, prior art techniques have employed the inherent physical properties of a magnetic device having a core and at least two windings, which develops a magnetic flux in response to an applied current. The flux that is produced in such a magnetic device is related to the number of turns in its windings and the current through the windings. Such technique is particularly useful, since the windings of a magnetic device can easily be insulated to withstand the large voltage differences within the TWT power supply. A magnetic flux indicative of a helix current can be produced by employing two identical, electrically isolated windings with oppositely directed current flows. The resulting flux will be related to the difference between the two currents. To measure helix current, the cathode and collector currents of the TWT are applied to such a device, producing a flux which is proportional to the helix current. The flux, in turn, may be sensed by measuring the inductance of a sense winding on the device. This technique is based on the fact that the flux influences the permeability of the magnetic core of the device, and the permeability in turn determines, by a known function, the inductance of the sense windings.

However, in practice it is difficult to reliably relate a flux to an inductance by this method, since permeability varies according to several factors, including core material, flux density, and temperature. Typically, pemeability varies by a factor of 3:1 over a temperature range of −55° C. to +125° C., which is the temperature range over which TWTs must operate in many applications.

Therefore, although magnetic devices can be adapted to operate in the high-voltage environment of TWTs, their usefulness as helix current indicators over extended temperature ranges is severely limited.

Another limitation of prior art techniques is that they have principally employed an "incremental" approach, in which the magnetic device is operated in magnetic saturation for all currents except a narrow band of current levels in the vicinity of a predetermined desired helix current. Such predetermined helix current level will be referred to herein as a helix trip current, since it is the current limit above which an alarm is triggered to indicate an impending tube failure or other operational problem.

A magnetic device follows a magnetization curve which varies between negative and positive saturation levels in response to respective negative and positive currents that pass therethrough. The incremental approach uses the changing magnetic flux of the device as it passes between negative and positive saturation through the non-saturated region to produce an electrical pulse, which is processed by sensing circuitry to indicate that the trip helix current has been passed. In order to obtain a substantial pulse, such techniques employ a high rate of change of magnetic flux.

This method can employ windings having many turns to give very sensitive sensing of helix currents at or near the trip current point. However, the method is disadvantageous in that for a very rapid rise in helix current, which can easily occur in the TWT in normal operation, such as when an arc occurs or when a TWT becomes "gassy", the trip point may be passed so rapidly that the circuitry fails to respond. A sufficient degree of high-frequency response cannot easily be provided. Further, this method does not solve the problem of the large magnetic permeability variations over temperature noted above. Also, the incremental method cannot provide a reading of the actual helix current.

SUMMARY OF THE INVENTION

Accordingly, an important feature of the present invention is to provide a current sensing device for sensing the helix current to a TWT which provides a reliable indication of the helix current over an extended temperature range. The sensing device includes magnetic material and associated electrical conductors. The magnetic material and conductors may advantageously form one or more toroidal inductors. The cathode and collector currents of the TWT are caused to flow in opposite directions through the sensing device to generate a flux in the magnetic material which is related to the difference between the cathode and collector currents, which equals the helix current. The helix current is then detected by indirectly sensing the magnetic flux in the magnetic material.

The readable magnetization range employed in the invention is not limited to a narrow band of helix currents as in the prior art, but extends from zero helix current to about 50 percent above the desired maximum helix current. Thus, the sensing technique of the invention is not an incremental encoding technique as in the prior art, but rather, because of its extended sensing range, is advantageously an absolute encoding technique.

To compensate for temperature-induced magnetic permeability fluctuations, means are provided for passing an additional bias current through the sensing device, for example on a separate bias winding, which modifies the permeability of the magnetic material by changing the total flux. The value of the bias current is controlled to change with temperature, such that for a given value of helix current, constant permeability is maintained.

For example, it is a property of magnetic material, otherwise suitable for this purpose, that its permeability increases with decreasing temperatures and decreases as more current is applied to its windings. Therefore, as the ambient temperature decreases, the bias current may be increased to counteract the effect of this temperature variation. Thus, in a system which incorporates the invention, any observed change in permeability will unambiguously indicate a change in helix current. Thus, with the invention, an absolute and reliable indication of helix current may be obtained by sensing magnetic permeability as an indication of current-generated magnetic flux.

The current sensing device further includes means for measuring the permeability of the magnetic material and for producing an electrical signal which is representative thereof. It is particularly useful to employ a sense winding which is wound on the magentic material. As is well known, the inductance of the sense winding is proportional to the permeability of the core. Because of the above-described biasing arrangement, the permeability is compensated for temperature changes, so as to be determined substantially only by helix current. Thus, the inductance too is determined substantially only by the helix current.

Relying on this principle, an alternating current is passed through the sense winding to sense the inductance. The resulting voltage drop across the inductance of the sensing winding is the desired indirect measurement of the helix current.

According to one embodiment of the invention, an overall sensing system includes a sensor magnetic device and associated windings, and a reference magnetic device and associated windings. The two devices preferably contain magnetic toroids, each forming an inductor with its respective windings.

The windings of the reference inductor include a reference winding to which is supplied a constant reference current having a fixed relationship with the helix trip current, a bias winding which is coupled to a bias current generator for receiving a bias current therefrom and passing the bias current on to the bias winding of the sense inductor, and a sense winding for sensing the permeability of the reference inductor.

The windings of the sense inductor include cathode and collector windings which carry respectively the cathode and collector currents, a bias winding to which is supplied the bias current from the reference inductor, and a sense winding for sensing the permeability of the sense inductor.

The sense winding of the reference inductor produces a reference output voltage which is supplied to the bias current generator. As the ambient temperature changes, the reference output voltage will also tend to change. The bias current generator will, however, respond by altering the bias current to the reference inductor to maintain the reference output voltage constant. Hence the flux in the reference inductor and its permeability are also maintained at a constant value which depends only on the constant reference current, and is not affected by temperature changes.

The sense and reference inductors are selected to have closely matched magnetic characteristics. Since the same bias current flows in both inductors, the sense inductor is also temperature-compensated. Thus, any change in the permeability of the sense inductors is attributable substantially only to a change in the helix current. Sensing the inductance of the sense winding of the sense inductor yields, therefore, an indication of the helix current.

According to another aspect of the present invention, a common oscillator is provided for supplying the alternating current to the sense windings of both the reference and sense inductors. In this manner, the currents in the respective sense windings are normalized. Means may also be provided for controlling the bias current generator in response to the oscillator amplitude, so as to compensate the system for any change in the oscillator amplitude.

According to another aspect, a comparator may be included to provide a logic level indication whenever the helix current exceeds a predetermined value. A voltage divider and associated peak detecting circuit may be used with the sense winding to provide to the comparator a DC voltage representative of the helix current.

In multi-TWT systems, effective monitoring of the helix current of each TWT is obtained by providing a respective sense inductor for each TWT and a comparator for detecting excessive current in each TWT. A single reference inductor and an electronic block consisting of a reference current generator, a bias current generator and an oscillator is sufficient for driving the sense inductors of a plurality of TWTs. This is possible because all of the magnetic components are preselected to possess matching magnetic properties.

In a particularly effective embodiment, the sense inductor and the reference inductor each include first and second toroids which are located close to one another. The sense winding is wound around the first toroid in a first direction and then over the second toroid in an opposite direction to insure that as a current passes through the sense winding, it creates within the two toroids flux densities which compensate one another. On the other hand, all the other windings are advantageously wound on both toroids as a unit. The currents which are passed through the sense winding are set at values substantially below the helix current, to lessen any magnetic influence of the sense winding on the permeability of the toroids. It has been discovered that with the double-toroid embodiment described above, a sense current up to about 10–30 percent of the helix current may be applied to the sense winding without changing the permeability more than about 4 percent of the value resulting from the helix current alone, depending on the specific application.

The invention permits the use of sensing circuitry having substantially narrower bandwith than in the prior art, since the relevant currents change more slowly. Thus the "false alarm rate" caused by high-frequency noise, particularly in electrically noisy environments, is substantially lower than with prior systems.

Other objects, features and advantages of the present invention will be learned from the following detailed description of preferred embodiments of the invention, with reference to the accompanying drawings.

FIGS. *7a* and *7b* illustrate a preferred method of constructing a toroidal inductor for use in a helix current sense system.

Figure 8:
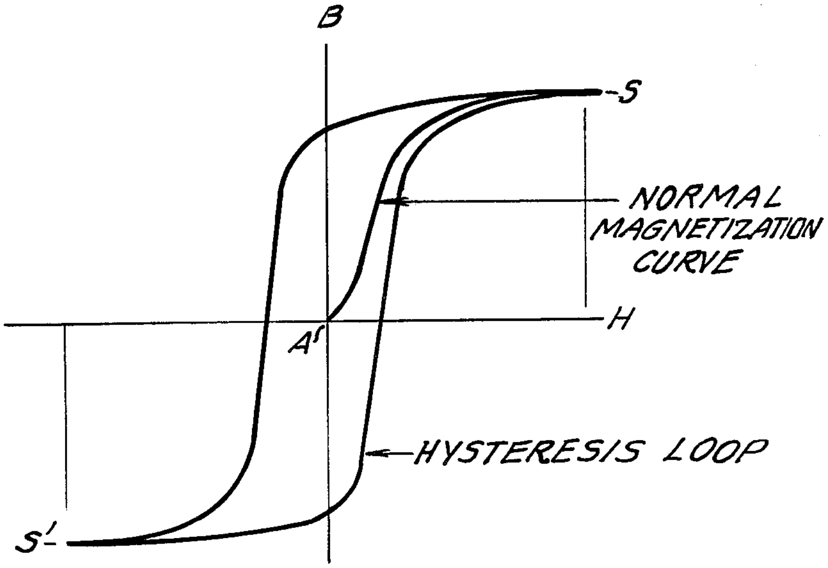

FIG. 8 shows a typical magnetization curve for magnetic materials.

DETAILED DESCRIPTION OF PREFERRED EMBODIMENTS

Figure 1:
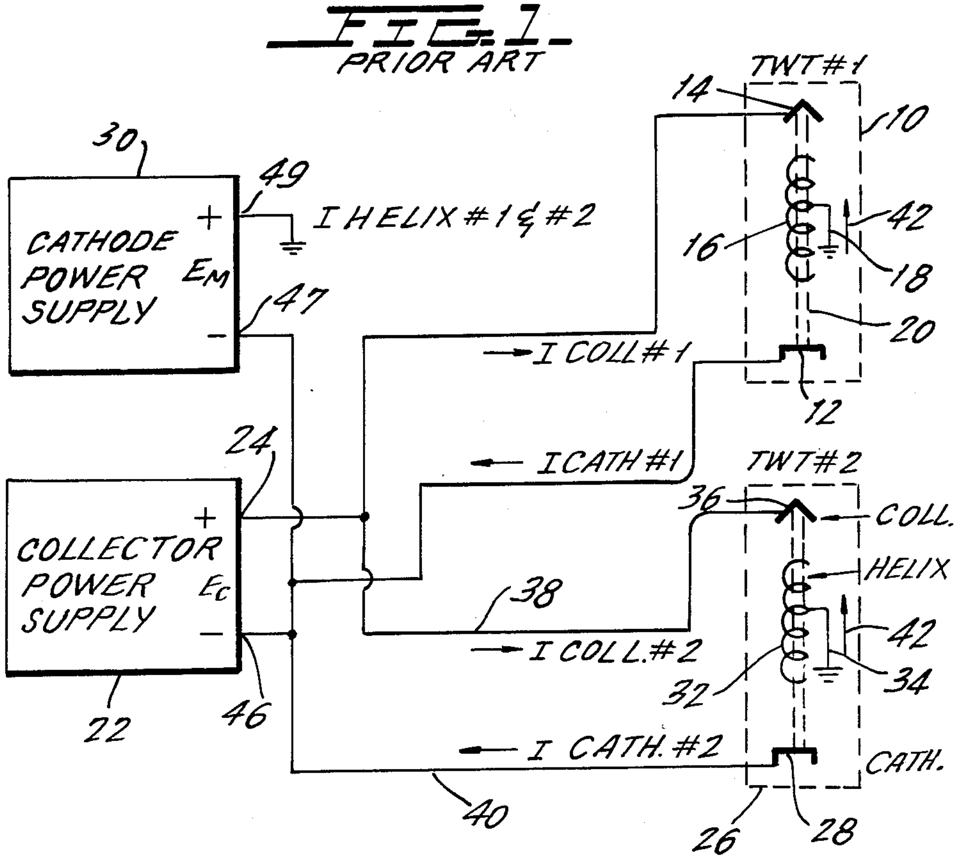
FIG. 1 PRIOR ART
FIG. 1 is a schematic diagram of a prior art arrangement of a pair of traveling wave tubes connected to a power supply.

FIG. 1 illustrates a prior art arrangement of a pair of TWTs and appropriate power supplies. A first TWT 10 includes a cathode electrode 12, a collector electrode 14, and a helix 16. The helix 16 is a helically wound conductor which is positioned between but not connected to the cathode 12 and the collector 14. The helix 16 is connected to ground potential through line 18.

A stream of electrons 20 is emitted from the cathode electrode 12 toward the collector electrode 14. As already noted, optimal TWT operation is indicated when only a small percentage of the stream of electrons 20 impinge upon the helix 16, most of the electrons being captured by the collector electrode 14.

Typically, the cathode electrode 12 is maintained at a voltage of approximately −4,000 volts, and, the collector electrode 14 at a potential of approximately +2,000 volts with respect to the cathode; that is, at an absolute potential of about −2,000 volts. The voltages for operating the TWTs are produced by a cathode power supply 30 having a negative terminal 47, supplying −4,000 volts, which is connected to the cathode electrode 12 of TWT 10. The cathode supply 30 also has a positive terminal 49 which is connected to ground, and is also connected to the helix 18 of TWT 10. The collector supply 22 has its negative output terminal 46 tied and referenced to the −4,000 volt cathode supply terminal 47, and its positive output (+2,000 volts with respect to the negative terminal 46) tied to the TWT collector 14.

A second TWT 26 has an identical cathode 28, collector 36, and helix 32. The second TWT 26 is wired in parallel to the first TWT 10 through lines 34, 38 and 40. The helix currents within TWT 10 and 26 are indicated by arrows 42. The helix current in TWT 10 consists of the cathode current minus the collector current. The cathode current flows between the cathode terminal 12 and the respective negative terminals 46, 47 of the collector supply 22 and the cathode supply 30. Also, a positive collector current flows from the positive terminal 24 of the collector power supply 22 into the collector electrode 14. Note that although the electron beam travels from the cathode electrode to the collector electrode, according to the positive convention a positive current is considered to flow in the opposite direction. When only a single TWT is used, the helix current equals the current that flows through the helix ground return 49 of cathode power supply 30. Where, however, more than one TWT is connected to the same cathode power supply, the individual helix current in each TWT is not directly ascertainable in the ground return line.

In typical miniature TWTs, the cathode current is of the order of 100–125 milliamps and the maximum acceptable helix current is of the order of 10 pecent of that, or approximately 10–15 milliamps. An object of the invention is therefore to provide a system for sensing the helix current with sufficient accuracy and reliability to insure prompt detection of helix currents which exceed a predetermined limit of, for example, 15 milliamps. Experience has shown that reliable helix current sensing requires resolution of the helix current to an accuracy of about 10 percent of the maximum allowable helix current, or approximately 1 milliamp in this example. This accuracy should be maintainable despite large variations in the cathode and collector voltages of the TWT and the other operational voltages thereof. In addition, the extensive usage of TWTs in harsh environments requires reliable and accurate sensing of helix currents over a temperature range of about −55° C. to +125° C. As has been noted, the high TWT voltages do not permit direct measurement of the helix current through conventional electronic means.

Figure 2:
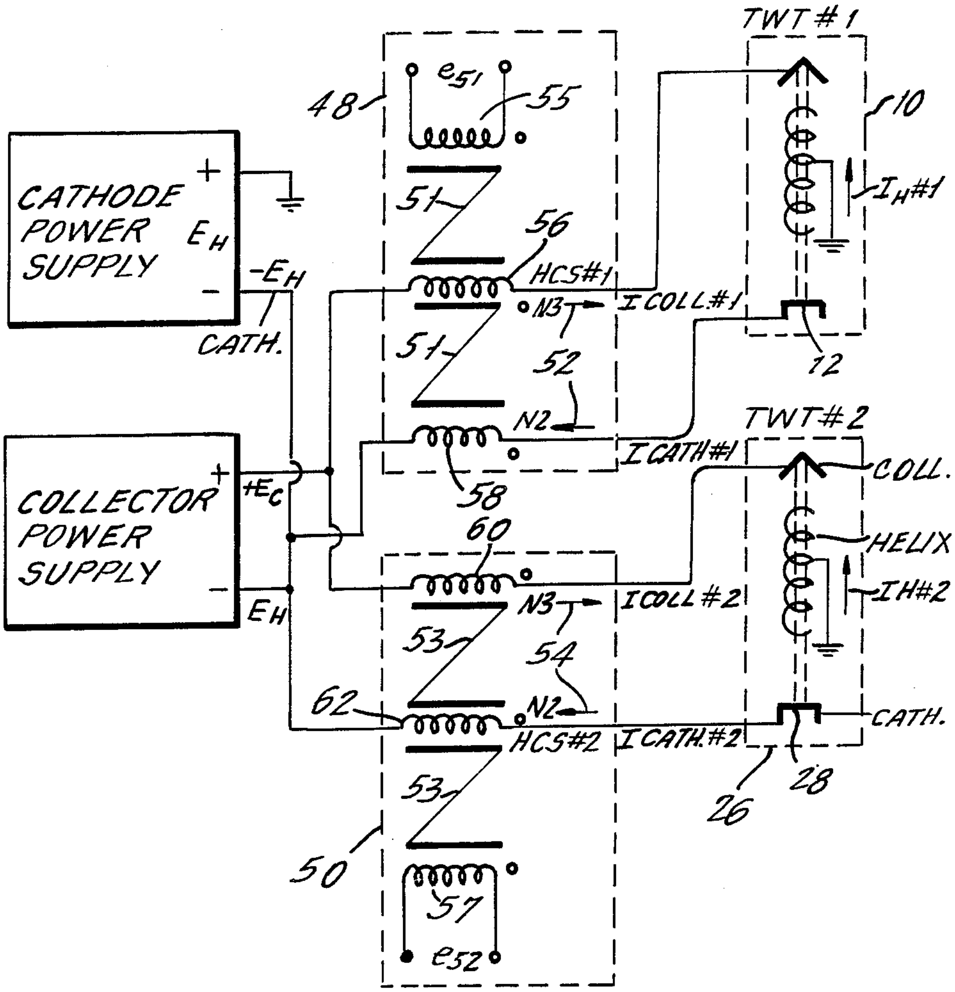
FIG. 2 PRIOR ART
FIG. 2 is a schematic diagram of a prior art arrangement similar to FIG. 1, having non-temperature-compensated inductors for sensing the helix current.

FIG. 2 illustrates a known modification of the circuit of FIG. 1, wherein a pair of magnetic devices 48, 50 are provided for sensing the helix current in the first and second TWTs 10, 26, respectively. The magnetic devices 48, 50 include respective collector windings 56, 60 and cathode windings 58, 62 which are wound about cores 51, 53 of magnetic material. As shown by arrows 52 and 54, the currents through the windings 56, 68 and 60, 62 flow in opposite directions. Thus, the flux in core 51, for example, and hence its permeability, is related to the helix current, i.e. the net current that flows through the windings 56 and 58 of TWT 10. Respective sense windings 55, 57 are also provided on the two cores.

In accordance with the well-known behavior of magnetic materials, as the net helix current begins to build up, the magnetization of the core 51 initially follows the normal magnetization curve A–S shown in FIG. 8, and subsequently follows the hysteresis loop S—S'. In the prior art, a rapid change of flux accompanies a change of helix current, as the device is rapidly driven between positive and negative saturation. Note that most of the loop S—S' is nearly vertical. The flux change can be used to generate a pulse to indicate whether a predetermined helix current value has been exceeded. Alternatively, if desired, an actual value of the helix current can be determined over the narrow range of currents between point A (no saturation) and point S, which represents maximum saturation of the core 51.

However, as has been noted, this approach produces an indication of helix current values only over a narrow current range in the immediate vicinity of a predetermined trip current. A surge in helix current which passes rapidly through the unsaturated region of the core can be missed by detection circuitry. Further, this method does not provide an absolute measurement of helix current over an extended temperature range.

Figure 3:
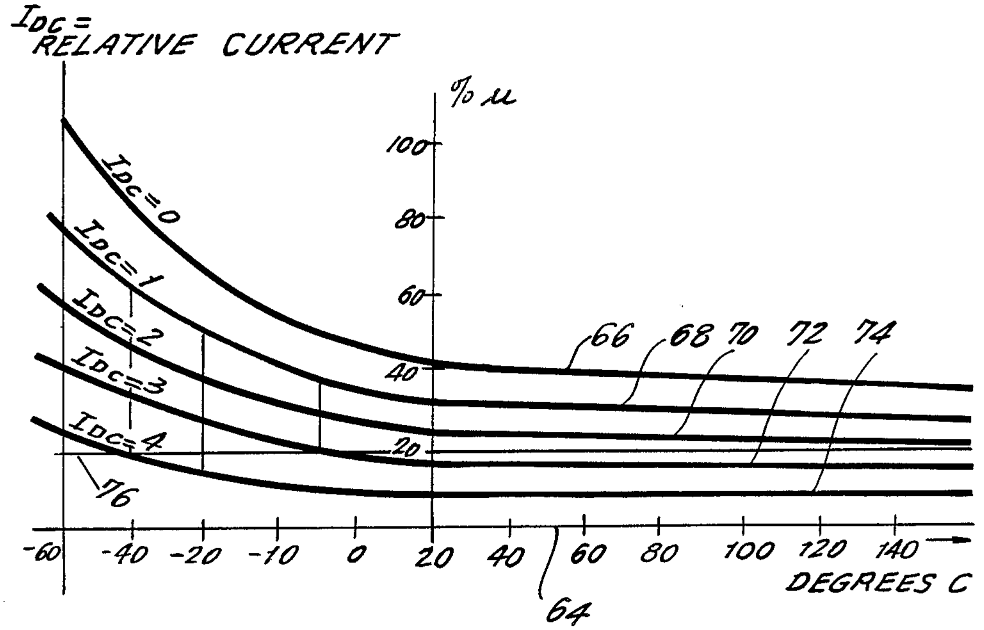
FIG. 3 is a plot of the normalized permeability of a core as a function of temperature and relative DC current through its windings.

FIG. 3 is a plot of the permeability of a core 51, 53 versus temperature and relative net current in the windings which surround the core, which will be used to explain the invention. The abscissa 64 is graduated in degrees Celsius and the ordinate axis shows the normalized permeability of the core. The permeability of the core at −55° C. with a winding current $I_{DC}$ of 0 milliamps is assumed to represent 100 percent permeability. For a winding current of 0, for example, as represented by curve 66, the permeability will drop to approximately 42 percent at 20° C. and to approximately 38 percent at a temperature of 125° C. The permeability curves at other relative operating currents are indicated by curves 68, 70, 72 and 74.

The relative DC currents shown in FIG. 3 correspond to the helix current which flows in the magnetic devices 48 and 50 of FIG. 2. Over the range of helix currents of particular interest to the present invention, it has been found that pemeability varies by a factor of approximately 3:1 over the temperature range of from −55° C. to +125° C. The variation in permeability is particularly severe at the lower temperatures. For this reason, the prior art has not successfully used a measurement based on permeability as an indication of helix current, from 0 to maximum, over an extended temperature range.

Figure 4:
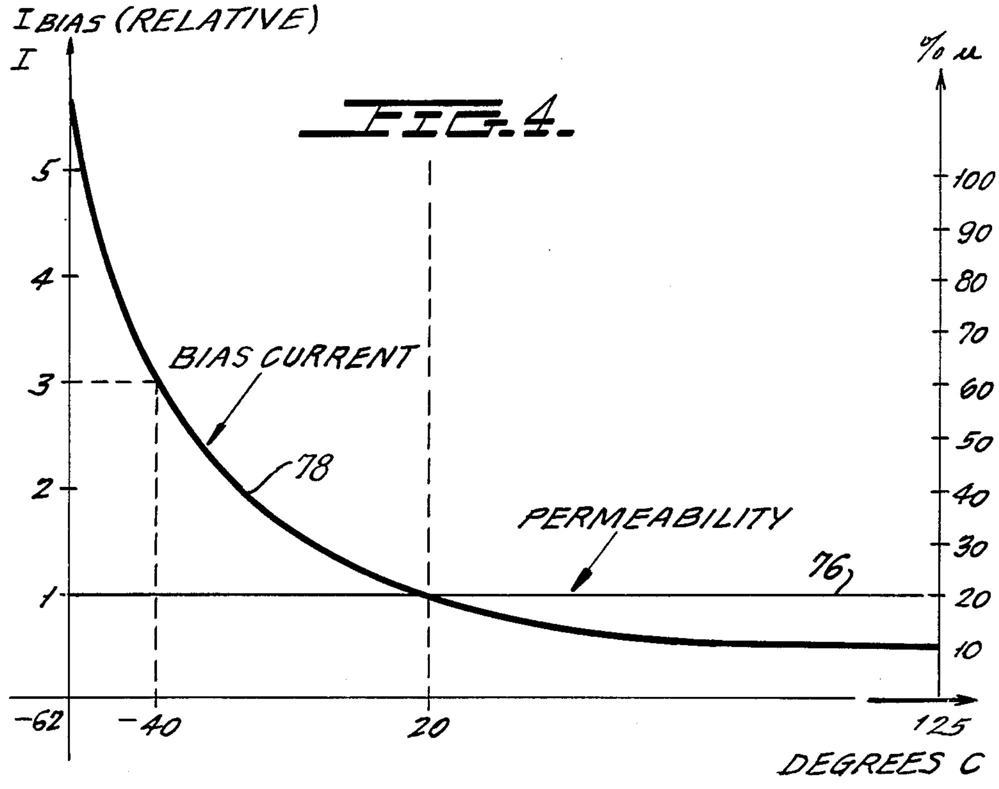
FIG. 4 is a plot of relative bias current versus temperature, showing relative bias currents to be supplied to the bias winding in order to stabilize the permeability of a core with respect to temperature.

However, it has been found to be possible to stabilize the permeability of an inducator over the entire temperature range of interest, by use of the present invention. As represented by the line 76 shown in FIGS. 3 and 4, an essentially constant permeability characteristic can be achieved over the entire temperature range, as follows. Let it be assumed that a constant relative helix current of 1 unit flows through the magnetic device. At a temperature of −40° C., the curve 68 of FIG. 3 indicates a permeability of about 60 percent. Various other values of permeability exist at other temperatures.

However, assume that it is desired that this 1 unit of relative helix current produce a normalized constant flux of 20 percent in the magnetic device. This is found to be achievable by adding an additional winding to a device similar to those in FIG. 2, and passing through it a bias current having a value which varies with temperature according to the curve 78 of FIG. 4.

As shown, the required bias current has very small values at temperatures above 20° C. but it increases rapidly as the temperature drops to −55° C. The bias current increases the flux density within the core so that the permeability remains constant over the full temperature range. For example, at a temperature of −40° C., the bias current is about 3 relative units. When added to the helix current of 1 unit, this results in an effective total DC current of 4 relative units. Referring to FIG. 3, the operating point is moved vertically from curve 68 to curve 74, resulting in the desired permeability of 20 percent.

Thus, by superimposing the flux from the bias winding, upon the flux which is attributable to the steady state helix current, the permeability of the core can be held constant over the full temperature range, for a given helix current, here 1 relative unit. If the helix current increases, the permeability will fall below the given permeability. Such drop in permeability will be solely attributable to the variation in the helix current, since the permeability has been compensated for changes in temperature. Temperature compensation of permeability, through the addition of a bias current, is a central feature of the present invention, embodiments of which are shown in FIGS. 5–7.

Figure 5:
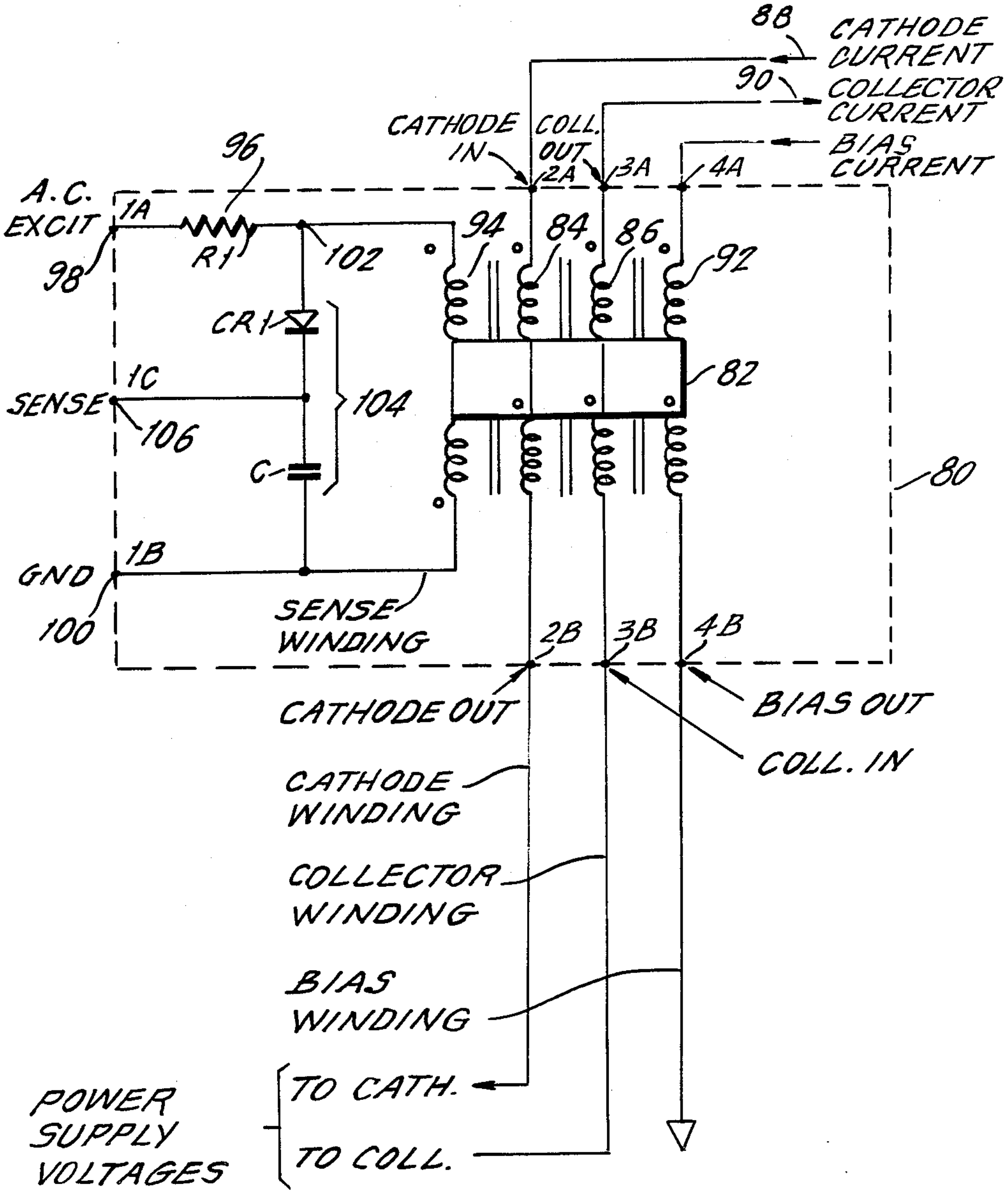
FIG. 5 is a schematic diagram of a helix current sense system, including sense and reference inductors and an inductance measurement circuit, which is used for measuring helix current according to an embodiment of the present invention.
Figure 6:
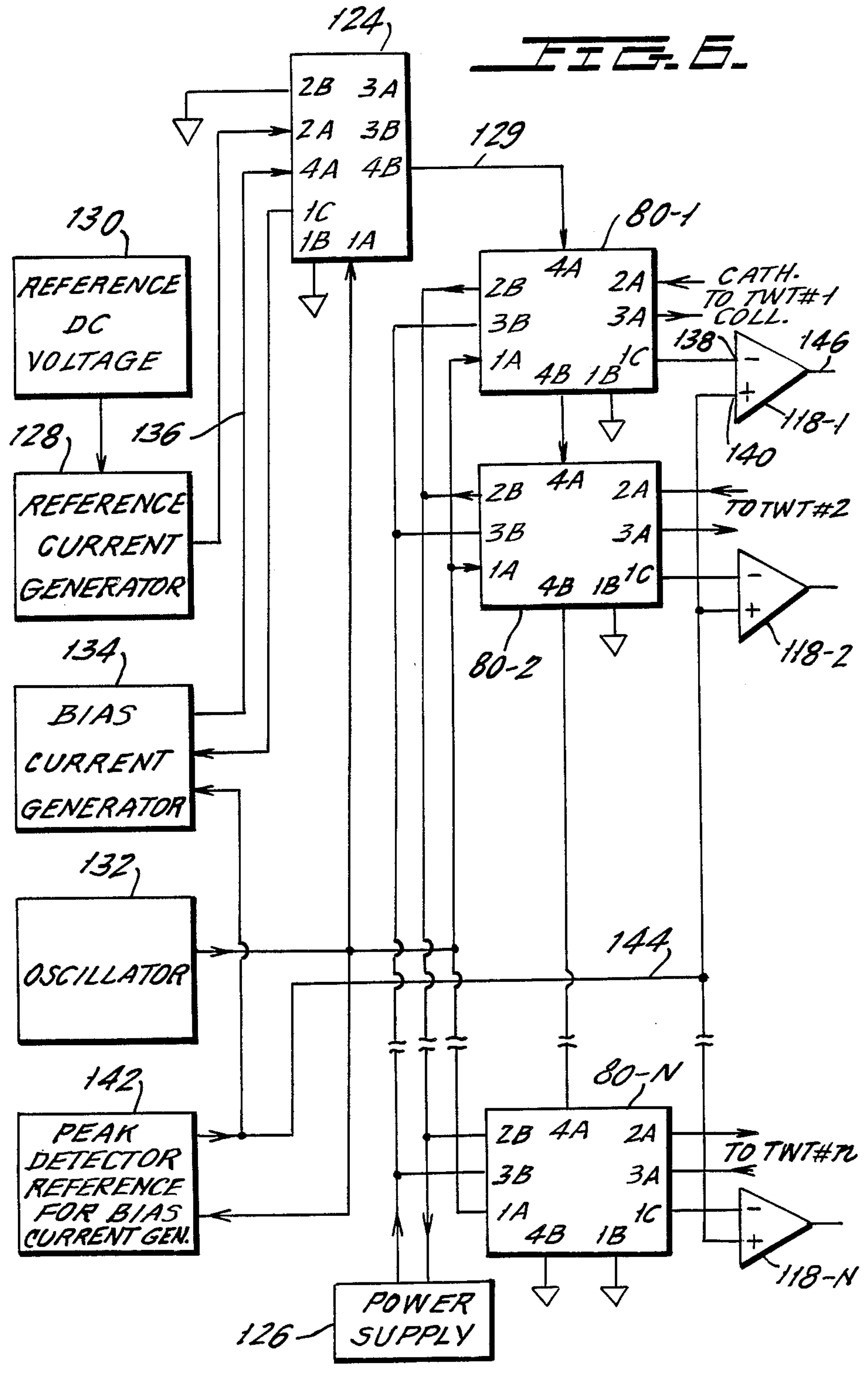
FIG. 6 is a block diagram of a system for measuring the helix current of one or more TWTs in accordance with another embodiment of the present invention.

FIG. 5 is a schematic diagram of a magnetic device 80 according to an embodiment of the invention, which is similar to the device shown in FIG. 2, but includes means for stabilizing its magnetic pemeability over temperature. To this end, the temperature-stabilized magnetic device 80 includes a magnetic core 82 upon which are wound a plurality of windings. These windings include a cathode winding 84 which is connected between the cathode electrode 12 of the TWT 10 and the negative terminals 46, 47 of the power supplies 22 and 30, respectively. They further include a collector windings 86 which is connected between the collector electrode 14 and the positive terminal 24 of the power supply 22. The arrows 88 and 90 indicate that the respective currents in these windings flow in opposite directions. The windings 84 and 86 magnetize the core to a level which is related to the helix current and establish the magnetic permeability of the core at a corresponding level.

A bias winding 92 is wound on the core 82 and is supplied with a bias current 78 determined according to a function such as that described above and illustrated in FIGS. 3–4. The bias winding biases the flux density in the core 82 such that, as has been noted, the permeability of the core remains substantially constant for a given helix current at any temperature, as shown by the straight line 76 in FIG. 4. The means for generating the bias current will be described further below.

To measure permeability of the core 82, an inductor comprising a sense winding 94 on the core 82 is provided. The inductance of an inductor is proportional to the permeability of its associated magnetic material. To measure this inductance, the sense winding 94 is connected in series with a resistor 96 to form a voltage divider consisting of resistor 96 and the inductance of the sense winding. The inductor 94 and the resistor 96 are interconnected at a node 102. The free end of sense winding 94 is connected to ground, and the free end of resistor 96 is connected to an excitation terminal 98.

An AC signal is applied between the excitation terminal 98 and ground terminal 100. An AC signal appears at the node 102 whose amplitude is directly related to the inductance of the sense winding 94, and hence to the helix current. This voltage is sensed by a peak detector 104 which includes a series connection of a diode CR1, and a capacitor C. The peak detector rectifies the voltage at node 102 and produces a DC voltage at a sense terminal 106 (connected to the junction between diode CR1 and capacitor C), which is proportional to the peak level of the AC signal at node 102 and therefore representative of helix current.

Several considerations are important for proper operation of the helix current sensor shown in FIG. 5. First, the currents that flow in the sense winding 94 should by only a small fraction of the net value of the other currents in the core 82 to ensure that the permeability of the magneic device is not significantly affected by the measurement procedure. Second, the number of turns in the sense winding should be selected to provide sufficient measurement sensitivity for helix currents which range from negligible values to approximately 50 percent over the trip helix current. The trip helix current is a helix current value which is selected to indicate an alarm condition; for example, 15 milliamps in a typical miniature TWT. Third, the voltage divider 104 should use relatively small components with values which do not produce excessive heat dissipation and electrical driving constraints.

Advantageously, the cathode, collector, and bias windings have an equal number of turns, and the ratio of the number of turns in the sense winding to said equal number of terms is in the range of about 4:1 to 20:1, a particularly useful ratio being about 8:1.

Figure 7A:
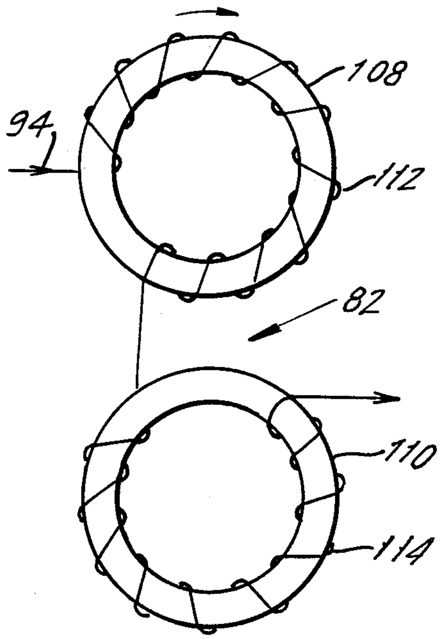
Figure 7B:
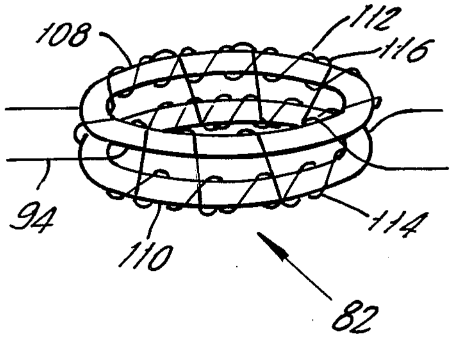

In a helix current sensing system, the following construction of the core 82 and the windings 84, 86, 92, 94 has been found to provide all of the above-noted features. As shown in FIGS. 7*a* and 7*b*, the magnetic core 82 is formed of two toroids 108 and 110. Referring to FIG. 7*a*, the sense winding 94 includes a first winding section 112 which is wound, for example, clockwise around the upper toroid 108. A second winding section 114 is wound along the lower toroid 110, in the opposite direction, i.e. counterclockwise. Thereafter, the upper and the lower toroids 108, 110 are placed coaxially next to one another, as shown in FIG. 7*b*.

Next, the bias winding 116 is wound around both toroids, with both toroids being enclosed as a unit within each turn of the bias winding. The number of turns of the bias winding depends on the specific application. It should be sufficient for the ampere-turns of developed flux to place the toroids in a nonlinear range near their early saturation region. The sense winding should have 5–10 times as many turns, in order to give good sensitivity for small sense currents.

The inductor and bias windings 94 and 116, it should be noted, carry low voltages. The cathode and collector windings (not shown in FIG. 7*b*), on the other hand, are at very high potentials (−4,000 and −2,000 volts, respectively, in this example). The cathode and collector windings are wound in the same manner as the bias winding 116, employing suitable insulation.

The cathode and collector windings are constructed of a heavy gauge wire, which is important for carrying the large currents that flow in the cathode and the collector. A significantly larger number of conductor turns is used in the sense winding, which produces the desired high degree of current resolution over the full range of helix currents. Also, the manner of winding the sense winding 94, first in one direction on the first toroid 108 and then in an opposite direction on the second toroid 110, produces opposing magnetic flux in the upper and lower toroids which, because of their proximity, tend to compensate one another. It has been found that the sense winding 94 as described above results in 6 to 10 times greater precision in current sensing than in comparable arrangements where such opposed polarity windings are not used.

In operation, very favorable results were obtained when the excitation voltage consisted of a high frequency sinusoidal input which was applied to the inductor winding 94 through a large value resistor 96. The current flowing in the sense winding 94 is advantageously about 10 to 30 percent of the DC helix current. Such current level has been found to have very little effect on the permeability of the magnetic core. Thus, very reliable measurement of the permeability of the magnetic core is obtained.

An overall block diagram of a sense system which can be used for sensing the helix current of a plurality of TWTs, and for producing an alarm signal when the helix current of any one of the TWTs exceeds a predetermined value, appears in FIG. 6.

This system includes an array of N TWTs, only three of these being shown. Each TWT is associated with a respective magnetic current sensing device 80-1, 80-2, . . . , 80-N and a respective comparator 118-1, 118-2, . . . , 118-N. The magnetic current sensing devices 80-1 through 80-N will be referred to collectively as the magnetic current sensing devices 80. Similarly, the comparators 118-1 through 118-N will be referred to collectively as the comparators 118. The magnetic sensing devices 80 are identical to the magnetic device 80 shown in FIG. 5, and the terminal input legends 1A, 1B, 2A, 2B, etc., denote identical terminals in both Figures. Note that while the present invention is particularly useful with multiple-TWT systems, it is equally operable with a single TWT.

The system further includes a reference magnetic device 124 which is preferably, but not necessarily, constructed in the same way as the device 80.

The ability of the present invention to achieve its objects with the system shown in FIG. 6 is based on the following important principle. Referring to FIG. 3, it is seen that a core in a typical inductor exhibits large permeability variations which are dependent both on the current in associated windings and on the temperature of the core. However, the permeability curves of a given core are very regular and decrease monotonically. Also, these curves are repeatable as a function of both DC current magnetization and temperature.

Not only are the curves repeatable over temperature, but further the shapes of the curves are surprisingly similar as the current changes, although the magnitude of permeability may change as much as ±30 percent. Tests have shown that cores can be grouped into batches which have relatively closely matched permeability curves. It is possible to group cores into batches wherein the permeability curves of the cores in each batch do not vary by more than ±5 percent, which is more than adequate accuracy for helix current measurement.

Matching of magnetic cores is hindered because the hysteresis of the magnetic materials and their recent magnetization history affects the measurement of permeability. However, such variations can be compensated by determining a means permeability of each core based on multiple measurements of the permeability of the core, and employing the mean permeability value for purposes of grouping cores into batches. This method substantially improves the matching of the cores and thus the consistency of operation of a device such as the system of FIG. 6. The various cores in the helix current measurement system of FIG. 6 should be selected to the greatest extent possible to exhibit identical magnetic properties.

The structure and operation of the sense system of FIG. 6 will now be described. Each magnetic device 80 is connected to its associated TWT as follows. The cathode of the TWT is wired to terminal 2A of device 80 and the cathode current returns through terminal 2B to a common power supply 126. The collector current of the TWT flows through terminals 3B and 3A from the power supply 126 to the TNT (not shown). The bias windings, located between terminals 4A and 4B (see also FIG. 5), of all of the magnetic devices 80 are connected in series. For example, terminal 4B of the first magnetic device 80-1 is connected to terminal 4A of the second magnetic device 80-2, and so on. Terminal 4B of the last magnetic device 80-N is connected to ground. Thus, the same bias current will flow through all the magnetic devices.

The bias current for all the bias windings is supplied through a line 129. This line is connected to the reference magnetic device 124, which is arranged as follows. The input to terminal 2A of the reference magnetic device (the cathode winding in device 80) is supplied with a constant reference current by a reference current generator 128 which in turn is driven by a reference DC voltage generator 130. The reference current has a fixed relationship to the selected trip helix current, and may be equal to the trip helix current.

Terminals 1A, 1B and 1C of the reference magnetic dvice 124 are connected to a sense winding 94, resistor 96, and peak detection circuit 104 as shown in FIG. 5. An oscillator 132 supplies a constant-amplitude sinusoidal excitation signal to terminal 1A of the reference magnetic device 124, which generates a generally constant DC voltage output at terminal 1C. Advantageously, a high frequency signal is employed, of the order of 50 kHz. The RMS magnitude of the oscillator current may usefully be about 10–30 percent of the helix current. The DC output from sense terminal 1C is supplied to bias current generator 134, which constantly monitors this output.

The bias current generator 134 is operative to keep the output at sense terminal 1C constant, as follows. The bias current generator 134 receives a peak detector reference voltage from a peak detector reference generator 142. The latter receives the constant AC signal from oscillator 132, detects its peak, and generates the reference voltage for the bias current generator. The reference voltage is a function of said peak, in order to compensate the system for any variation in the oscillator output amplitude. The reference voltage also compensates the system for the diode voltage drop in each peak detector 104. The same reference voltage is also supplied to the comparators on line 144, as will be discussed further below.

As the temperature of the reference magnetic device 124 changes, the permeability of the core 82 tends to rise or fall with the temperature. The inductance of the winding 94, and hence the output voltage at terminal 1C, will tend to follow such change in permeability. To compensate for this effect, the bias current generator 134 produces a compensatory bias current which is fed back by line 136 to terminal 4A of the reference magnetic device 124. This compensates for the permeability change and brings the sense output voltage at terminal 1C of the reference device 124 back to its previous level. Thus, the permeability of core 82 in reference device 124 is kept constant, irrespective of ambient temperature variations.

Note that all the magnetic devices in the system are subject to the same temperature variations, and, as noted above, have been matched to have the same permeability. Thus, by supplying all the devices 80 with the same bias current as the reference magnetic device, the permeabilities of the devices 80 may also be temperature-stabilized Thus, as shown, the bias current, from terminal 4B of the reference magnetic device 124, flows serially through all the remaining magnetic devices. The permeability of the magnetic devices in the system will remain constant over the full temperature range so long as a constant helix current flows through them.

If, however, the helix current of a given TWT changes, that change will produce a permeability change in its associated magnetic sensor which can be sensed and quantified as follows.

Referring to magnetic device 80-1, which is connected to TWT #1 (see FIG. 6), terminal 1A is supplied with the constant AC signal from the oscillator 132. This signal produces at sense terminal 1C of device 80-1 a voltage which is indicative of the permeability of the core 82 of device 80-1. If the helix current increases, the sense output voltage at terminal 1C will decrease, because permeability and hence inductance varies inversely as helix current. The output at terminal 1C is connected to a negative input 138 of a comparator 118-1. The positive input 140 of the comparator 118 is connected to the peak detector reference generator 142 and receives its reference voltage on line 144.

Ordinarily, for low helix currents, the inductance of the sense winding will be high, resulting in a level at negative input 138 that is higher than the reference level at the positive input 140. Accordingly, the output of the comparator at terminal 146 is ordinarily low. As, however, helix current increases, the output at 1C will fall below the value of the reference voltage and the comparator will change state to indicate that the helix current has exceeded a predetermined value. The comparator 118 may be provided by known means with an appropriate delay or hysteresis to stabilize its output.

With the present invention, it will be noted, each TWT requires one magnetic device and one comparator only. The remaining circuit blocks, such as the reference current and the bias current generators, as well as the reference magnetic device 124, are common to all the TWTs. Also, the system produces at each comparator an output which indicates, independently of all other comparators, the condition of helix current within its associated TWT.

A further, and separately significant, improvement of the invention is that the alternating voltage of the oscillator 132 is supplied to all the magnetic devices and to the peak detector reference circuit 142 which produces the comparator reference voltage on line 144. Further, the level on line 144 is employed to stabilize both the bias current generator and the comparators. Thus, any change in the level of the oscillator output affects both the bias current and the reference voltage to the same extent. This reduces measurement errors; and reduces the complexity and cost of the required oscillator circuit, since elaborate stabilization is not required.

Although the present invention has been described in connection with preferred embodiments thereof, many other variations and modifications will now become apparent to those skilled in the art. It is preferred, therefore, that the present invention be limited not by the specific disclosure herein, but only by the appended claims.

What is claimed is:

1. A current sensor, comprising:

(a) a magnetic sensing device comprising magnetic material;

(b) current-carrying means associated with said sensing device; said magnetic material of said device having a predetermined permeability curve such that its permeability varies in relation to the temperature of said device and in relation to current that flows in said current-carrying means, said current-carrying means receiving a current to be measured;

(c) means for applying a bias current to said current-carrying means and for adjusting said bias current according to ambient temperature so as to substantially avoid any variation in the permeability of said magnetic material due to changes in temperature; said bias current applying means including (1) a magnetic reference device comprising magnetic material;

(2) current-carrying means associated with said reference device; said magnetic material of said reference device having a permeability curve substantially the same as that of said magnetic sensing device, such that its permeability varies in relation to the temperature of said reference device, and in relation to current that flows through said current-carrying means, in substantially the same way as in said magnetic sensing device;

(3) means for providing a substantially constant reference current to said current-carrying means of said reference device;

(4) means for measuring the permeability of said magnetic material of said magnetic reference device and for producing a feedback electrical output which is representative thereof;

(5) a bias current generator for sensing the value of said feedback electrical output and for producing said bias current, said bias current being supplied to said current-carrying means of said magnetic reference device so as to maintain said feedback electrical output at a substantially constant level; and (6) means for conducting said bias current from said magnetic reference device to said current-carrying means of said magnetic sensing device; and (d) means for sensing the permeability of said magnetic material of said magnetic sensing device and producing an electrical output which is represenative of said pemeability and of said current to be measured.

2. A sensor as in claim 1, in which said current to be measured is a helix current of a TWT, and in which said bias current is adjusted to avoid such permeability variation at least over a temperature range of about −55° C. to +125° C.

3. A current sensor system, comprising:

a plurality of magnetic sensing devices, each comprising magnetic material;

said magnetic sensing devices each having current-carrying means associated therewith; said magnetic material of all of said devices having substantially the same permeability curve, such that the permeability of said material varies in relation to the temperature of said devices and in relation to current that flows in said current-carrying means; each said current-carrying means receiving a respective current to be measured;

means for applying a bias current to said current-carrying means of at least two of said sensing devices in series, and for adjusting said bias current according to ambient temperature so as to substantially avoid any variation in the permeability of said magnetic material due to changes in temperature; said bias current applying means including (1) a magnetic reference device comprising magnetic material;

(2) current-carrying means associated with said reference device; said magnetic material of said reference device having a permeability curve that is substantially the same as that of said plurality of magnetic sensing devices, such that its permeability varies in relation to the temperature of said reference device and in relation to current that flows through said current-carrying means, in substantially the same way as in said magnetic sensing devices;

(3) means for providing a substantially constant reference current to said current-carrying means of said reference device;

(4) means for measuring the permeability of said magnetic material of said magnetic reference device and for producing a feedback electrical output which is representative thereof;

(5) a bias current generator for sensing the value of said feedback electrical output and for producing said bias current, said bias current being supplied to said current-carrying means of said magnetic reference device so as to maintain said feedback electrical output at a substantially constant value; and (6) means for conducting said bias current from said magnetic reference device to said current-carrying means of said at least two magnetic sensing devices; and means for sensing the permeability of said magnetic material of each of said devices and for producing a respective electrical output for each of said devices which is representative of said permeability and of said respective current to be measured.

4. A sensor system as in claim 3, in which each said respective current to be measured is a helix current of a respective TWT associated with said magnetic sensing device, and in which said bias current is adjusted so as to avoid such permeability variations at least over a temperature range of about −55° C. to +125° C.

5. A current sensor for measuring a helix current of a TWT, said sensor comprising:

a magnetic sensing device having a magnetic core and first and second windings thereon for receiving, respectively, a cathode current and a collector current of said TWT, a bias winding for receiving a bias current, and a sense winding having an inductance which is related to a permeability of said magnetic core;

means for generating and controlling said bias current so as to substantially avoid any variation in said permeability of said core due to ambient temperature variations; said means for generating and controlling said bias current comprising:

(1) a magnetic reference device having a magnetic core whose permeability characteristics are closed matched to those of said magnetic core of said magnetic sensing device, said reference device having a reference winding for receiving a constant reference current, a bias winding for receiving said bias current, and a sense winding whose inductance is related to the permeability of said reference core;

(2) means for sensing the inductance of said sense winding of said magnetic reference core and for producing a feedback electrical output which is representative of said inductance; and (3) a bias current generator for sensing said feedback electrical output and for producing said bias current, said bias current being controlled so as to cause said feedback electrical output to remain substantially constant irrespective of ambient temperature variations; and means for sensing the inductance of said sensing winding and for producing an electrical output which is representative of said inductance and of said helix current.

6. A sensor as in claim 5, in which said bias current is so controlled at least over an ambient temperature range of −55° C. to +125° C.

7. A sensor as in claim 5, in which said reference current supplied to said reference device is related to a desired helix current value.

8. A sensor as in claim 5, further comprising:

a reference voltage source whose output voltage is related to a predetermined helix trip current; and a comparator having first and second inputs which are coupled, respectively, to said electrical output from said sensing device, and to said reference voltage source; and having an output which is indicative of whether said helix current substantially exceeds said predetermined helix trip current.

9. A sensor as in claim 5, in which said magnetic sensing core and said magnetic reference core are substantially toroidal.

10. A sensor as in claim 9, further including means for supplying alternating currents to said sense windings of said sensing and reference devices for measuring the respective inductance of each of said windings.

11. A sensor as in claim 10, in which said alternating current supplying means includes a high frequency oscillator, said alternating current having an RMS magnitude up to about 30 percent of said helix current.

12. A sensor as in claim 11, further comprising a first peak detector coupled to said magnetic sensing device and a second peak detector coupled to said magnetic reference device for sensing an AC signal across the respective sense winding of each said device, and for producing, respectively, said electrical output and said feedback electrical output.

13. A sensor as in claim 11, in which said toroidal cores each comprise first and second closely adjacent toroids, said second winding on each said core having a first section which is wound on said first toroid and a second section in series with said first section which is wound on said second toroid, the first and second winding sections having opposite winding polarities to produce opposite and substantially equal magnetization of said respective toroids.

14. A sensor as in claim 13, in which the first and second toroids possess closely matched permeability characteristics and in which each winding section comprises an equal number of conductor turns.

15. A sensor as in claim 14, in which said cathode, collector and bias windings have an equal number of conductor turns and in which the ratio of said conductor turns of said sense winding to said equal number of cnductor turns is in the range of about 4:1 to 20:1.

16. A sensor as in claim 5, in which said means for sensing the inductance of said sense winding includes a resistor in series with said sense winding, a peak detector circuit which includes a series-connected diode and capacitor connected in parallel with said sense winding, and an oscillator for producing an AC signal which is supplied to said resistor, said signal producing an AC signal across said sense winding, and said peak detector being responsive to said AC signal across said sense winding to produce a DC voltage having a value which is representative thereof.

17. A sensor as in claim 16, in which said alternating current from said oscillator is supplied to said sense winding of said reference magnetic device; and said bias current generating and controlling means further comprises:

a reference current generator for producing said reference current;

a bias current supply circuit coupled to said magnetic reference device, said bias current supply circuit being responsive to a feedback electrical output from said sense winding of said magnetic reference device for producing said bias current, said bias current being controlled by said bias current supply circuit so as to cause said feedback electrical output to remain substantially constant irrespective of ambient temperature variations;

a reference voltage source; and a comparator having first and second inputs which are responsive respectively to said DC voltage from said peak detector and to a reference voltage from said reference voltage souce, said comparator having an output for indicating whenever said helix current exceeds a predetermined value.

18. A sensor as in claim 17, in which said bias current supply circuit controls said bias current in response to said reference voltage from said reference voltage source.

19. A current sensor system for measuring the respective helix currents in a plurality of TWTs, said system comprising:

a plurality of magnetic sensing devices having magnetic cores with closely matched permeability characteristics, each magnetic sensing device having first and second windings for receiving, respectively, a cathode current and a collector current of a respective TWT, the difference between said currents being substantially equal to said helix current, a bias winding for receiving a bias current, and a sense winding;

means for generating and controlling said bias current so as to have a magnitude which causes the permeability of said cores to remain substantially constant for a given helix current, irrespective of ambient temperature variations; said means for generating and controlling said bias current comprising:

(1) a magnetic reference device having a magnetic core with permeability characteristics that are closely matched to those of said plurality of magnetic sensing cores, and having a reference winding for receiving a constant reference current, a bias winding to which is supplied said bias current, and a sense winding;

(2) means for sensing the inductance of said sense winding of said magnetic reference device and for producing a feedback electrical output representative thereof; and (3) a bias current generator for sensing said feedbak electrical output and producing said bias current, said bias current being controlled to cause said feedback electrical output to remain substantially constant irrespective of ambient temperature variations; and means for sensing the inductance of each of said sense windings and for producing a respective electrical output representative of said inductance and of said respective helix current.

20. A sensor system as in claim 19, in which said bias current is so controlled at least over a temperature range of about −55° C. to +125° C.

21. A method of measuring an electrical current, said method comprising the steps of:

(a) supplying a current to be measured to a magnetic current sensing device, so as to cause a magnetic material associated with said magnetic sensing device to have a permeability which is representative of said current to be measured;

(b) supplying a bias current to said magnetic sensing device;

(c) controlling the value of said bias current so as to substantially avoid variations of said permeability of said magnetic sensing device due to ambient temperature variations;

(d) wherein said bias current is produced and controlled by:

(1) supplying a constant reference current having a value which is related to said current to be measured to a reference winding of a magnetic reference device having permeability characteristcs associated therewith which are closely matched to corresponding permeability characteristics of said magnetic sensing device;

(2) producing a feedback electrical output which is related to the permeability of said magnetic reference device;

(3) applying said bias current to a bias winding of said magnetic reference device;

(4) controlling said bias current to cause said feedback electrical output to remain substantially constant irrespective of ambient temperature variations; and (5) supplying said bias current from said bias winding of said magnetic reference device to said bias winding of said magnetic sensing device; and (e) sensing said permeability of said magnetic sensing device and producing an electrical output which is representative of said permeability and of said current to be measured.

22. A method as in claim 21, in which said bias current is so controlled at least over an ambient temperature range of about −55° C. to +125° C., and in which said current to be measured is a helix current of a TWT.

23. A method as in claim 21, further including the step of making multiple measurements of the permeability of said magnetic sensing device and said magnetic reference device to calculate a mean permeability for each said device, and closely matching the mean permeability characteristics of said magnetic sensing and reference devices so as to minimize any pemeability measurement errors.

* * * * *